United States Patent [19]

Marschall

[11] Patent Number: 5,070,333
[45] Date of Patent: Dec. 3, 1991

[54] FREQUENCY-TO-DIGITAL CONVERTER USING A COMBINED COUNTED AND TIME METHOD

[76] Inventor: Klaus W. Marschall, Dornerweg 1, 7758 Meersburg, Fed. Rep. of Germany

[21] Appl. No.: 477,252

[22] Filed: Feb. 7, 1990

[30] Foreign Application Priority Data

Sep. 26, 1989 [DE] Fed. Rep. of Germany ....... 3931980

[51] Int. Cl.$^5$ ............................................. H03M 1/60
[52] U.S. Cl. .................................... 341/157; 341/155
[58] Field of Search ................... 341/155, 157, 63, 64, 341/166; 364/569, 724.06

[56] References Cited

U.S. PATENT DOCUMENTS

| | | | |
|---|---|---|---|
| 4,107,600 | 8/1978 | McMannis | 324/78 R |
| 4,123,704 | 10/1978 | Johnson | 324/782 |
| 4,128,892 | 12/1978 | Vasa | 364/569 X |
| 4,192,130 | 3/1980 | Takeuchi | 364/569 X |
| 4,251,869 | 2/1981 | Shaffer | 364/484 |
| 4,330,746 | 5/1982 | Stulting et al. | 324/78 D |
| 4,354,239 | 10/1982 | Kanegae | 364/569 X |
| 4,521,763 | 6/1985 | Murao et al. | 341/157 |
| 4,538,235 | 8/1985 | Henning | 364/569 |
| 4,558,301 | 12/1985 | Trofimenkoff et al. | 341/157 |

FOREIGN PATENT DOCUMENTS

3018463A1 11/1980 Fed. Rep. of Germany .
3033405A1 4/1981 Fed. Rep. of Germany .

OTHER PUBLICATIONS

McMillan, John Eric: "Design Notes in J–Phys E." Sci. Instrum. 20 (1987), pp. 1421–1422.
Paper entitled: "*Unterrichtsblater der Deutschen Bundepost*".

*Primary Examiner*—Benjamin R. Fuller
*Assistant Examiner*—Randy W. Gibson
*Attorney, Agent, or Firm*—Lee, Mann, Smith, McWilliams & Sweeney

[57] ABSTRACT

A frequency-to-digital converter is constructed as an integrated device in which the following functions are implemented: a processor bus interface (38) having data, address and control lines; at least one converter channel (10) having at least one clock generator (24), at least one input (12,14), frequency-to-digital converter means (18), a comparator (44) for comparing a digital frequency equivalent with a programmed digital word (limit value register (48)) and which is arranged to signal the exceeding of a limit value at an output (56) of the device through a programmable time-counter (50) (delay register (124)) as well as a status memory (flip-flop 52) and means (54) for the internal gating of external states, a command register (58) which is arranged to determine and initiate the conversion mode, a range register which is arranged to determine the conversion range (frequency range 22) as well as the test frequency (66) and a output frequency (67), and a status register (88) which is arranged to output information about the present state of the converter channel (10) to the processor; and a stand-alone sequencer (120) having an error function indicator and which is controlled through discrete input lines (128), for processor-independent configuration of the device from an external memory.

13 Claims, 1 Drawing Sheet

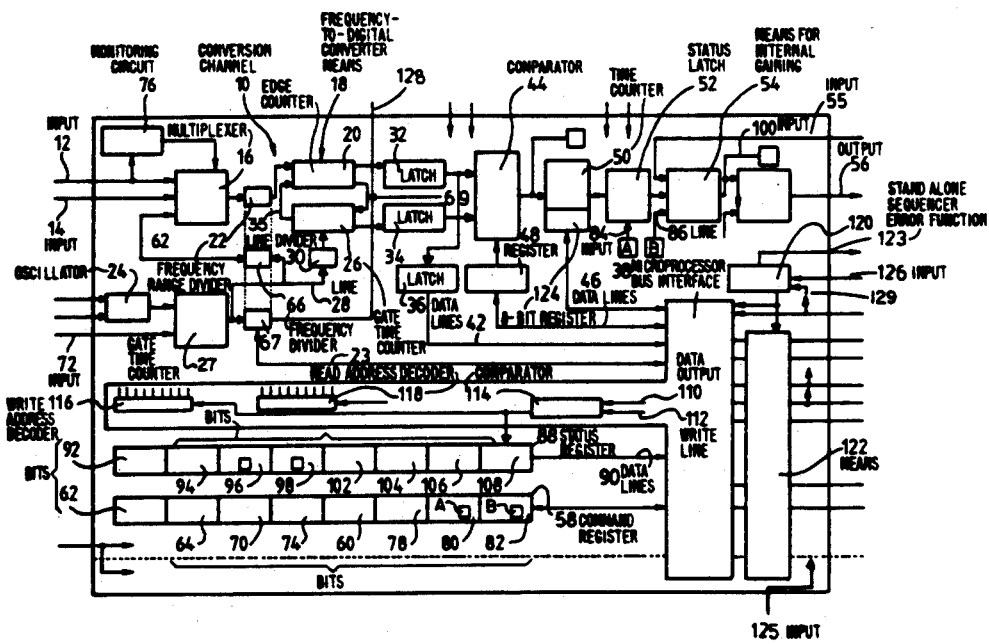

U.S. Patent     Dec. 3, 1991     5,070,333

FREQUENCY-TO-DIGITAL CONVERTER USING A COMBINED COUNTED AND TIME METHOD

TECHNICAL FIELD

The invention relates to a frequency-to-digital converter.

BACKGROUND ART

Different methods are known for converting frequencies into a digital word.

One method is the "counting method": a counter counts the edges of a frequency to be measured during a predetermined period of time. This time (gate time) period is determined by means of a reference frequency. To this end, a predetermined number of cycles of this reference frequency is counted.

Another method of frequency-to-digital converting is the "time method". In this method, within one gate formed by one or several cycles of the frequency to be measured, the time is determined by counting a reference frequency.

Finally, a combined counting and time method exists. In this method the edges of the frequency to be measured are counted according to the counting method. After the gate time has elapsed the remaining period of time till the beginning of the next full cycle of the frequency to be measured is determined.

The known methods are, according to the prior art, constructed with a plurality of discrete commercial components, such as counters. These components require much space. The production is complicated and expensive. The reliability of such a frequency-to-digital converter is low due to the large number of different components. Furthermore, it is difficult to test such a frequency-to-digital converter.

DISCLOSURE OF INVENTION

It is the object of the invention to provide a frequency-to-digital converter which is simpler to handle during production and requires less space than the known frequency-to-digital converters the converter has higher reliability and can be tested simply and the conversion behaviour and conversion range of which can be flexibly programmed.

Furthermore, the frequency-to-digital converter shall be in the position of monitoring whether an applied frequency exceeds a limit value.

According to the invention this object is achieved in that the following functions are implanted in an integrated device neither containing nor forming part of a microprocessor:

(a) a processor bus interface having data, address and control lines, (b) at least one converter channel having
   at least one clock,
   at least one input,
   frequency-to-digital converter means,
   a comparator for comparing a digital frequency equivalent with a programmed digital word arranged to signal the exceeding of a limit value at an output of the device through
   a programmable time-counter,
   a status memory and
   means for the internal gating of external states,
   a command register which is arranged to determine and initiate the conversion mode,
   a range register which is arranged to determine the conversion range (frequency range), the test frequency and the output frequency, and
   a status register which is arranged to offer information about the present state of the converter channel to the processor, and (c) a stand-along sequencer having an error function indicator and controlled by discrete input lines for processor-independent configuration of the device from an external memory.

Thus, a special device for the frequency-to-digital conversion is provided. This results in a reduction in cost and reduction of the required volume and weight. The reliability is increased, and testing and maintenance is facilitated.

The device can be used in combination with a processor (microprocessor). Then, it can be programmed by the processor for its particular operating mode conversion mode and frequency measuring range. Then, it converts a frequency which is to be measured and applied to its input into a digital word and makes this digital word available to be read by the processor.

However, the device can also operate independently of the processor. Then, the device can program itself from a data memory, e.g. an EPROM, for its particular operating mode task, e.g. for a certain conversion mode or a particular frequency measuring range.

The device is also able to monitor whether a frequency applied to its input exceeds a limit value.

The frequency-to-digital converter means can operate according to a combined count and time method. The converter channel can have at least two inputs and can operate either in the multiplex mode or in the redundancy mode of these inputs. That means that either the inputs can be switched by the processor by reprogramming the command word or the inputs can be switched automatically by monitoring a minimum frequency. In this case, the inputs are switched by automatic internal signal monitoring such that, in case of failure of the signal at one input, a switching over to another input is effected automatically.

The converter channel can operate in synchronous mode, a single conversion process being initiated by the processor. However, the converter channel can also operate in asynchronous mode. In this case converting process is started once and is then repeated automatically.

Writing on the device, such as the reprogramming of its registers, can be blocked by keywords.

The processor bus interface can be adapted to be switched to high resistance ("3-state") by a discrete device input to the device whereby the bus is adapted to be decoupled by a monitoring function (watch dog function).

Advantageously, the frequency-to-digital converter comprises a test circuit which permits testing the function of the device by the microprocessor. Internally generated known frequencies can be applied to the input of the converter channel. Several frequencies can be generated in each conversion range.

The processor bus interface can be changed in its operating mode to different types of busses by a pin of the integrated device.

Such a device can be used for the quick and precise conversion of frequencies into digital word. The device can also serve to automatically monitor and report maximum frequency values. With an analog-to-frequency converter connected in series, the device can be used for the construction of an analog-to-digital converter. These applications are possible in all units in which frequencies or voltages shall be detected by a processor (microprocessor).

Examples of such applications are engine controllers. Rotary speeds of engines which usually are output from their sensors as variable frequencies can there be converted into digital words. In the same way, temperatures from quartz crystal temperature sensors can be converted into digital words by a frequency-to-digital converter. A further application is the measurement of temperatures and pressures in engines. These quantities are output by the sensors in the form of small voltages. These voltages can be converted by a voltage-to-frequency converter into frequencies and can be transmitted. The frequency-to-digital converter converts these frequencies into digital words.

In order to prevent rotary overspeeds or overtemperatures without processor control, e.g. in engines, the device offers an independent measuring and comparing operation.

An embodiment of the invention will now be described in greater detail with reference to the accompanying drawing which shows a block diagram of a frequency-to-digital converter.

PREFERRED EMBODIMENT OF THE INVENTION

A converter channel 10 is illustrated in detail in the FIGURE. The converter channel 10 has two inputs 12 and 14 for frequency $FM_1$ and $FM_2$ which are to be converted. The inputs 12 and 14 can be applied to frequency-to-digital converter means 18 through a multiplexer 16.

Numeral 38 designates a microprocessor bus interface. Through the microprocessor bus interface 38 a microprocessor sets the starting bit 78 in the command register 58
one time in asynchronous mode (bit 60 in the command register 58 to "zero")
before each conversion in synchronous mode (bit 60 in the command register 58 to "one")
and, thus, releases the gate time-counter 26 which, in turn, releases the edge counter 20. The two counters start to count at the next positive edge of the measuring frequency FM.

The frequency-to-digital converter means 18 comprise a first counter 20 (edge counter) to which the frequency transmitted by the multiplexer 16 from input 12 or input 14 can be applied through a frequency range divider 22. The time-counter 26 receives a reference frequency $FR_2$ which is halved by the divider 30 from an oscillator 24 or an input 72 through a multiplexer 27. It releases the edge counter 20 which counts the edges of the frequencies $FM_1$ or $FM_2$. When the gate time-counter 26 has attained the gate time by counting a predetermined fixed number of reference frequency pulses, it blocks the edge counter 20 through line 35. The gate time-counter 26, however, continues to count until the next full period edge of the measuring frequency. Then, the gate time-counter is also stopped through line 69. "Gate time" is the time during which the gate time-counter 26 passes the frequency FM to the counter 20. The gate time-counter 26 provides a count which also includes the "fraction" of the last incomplete period of the measuring frequency, which is not included in the gate time. Thus, the edge counter 20 supplies a measure of the most significant bits (MSB) of the digital word representing the frequency to be measured, whereas the second counter 26 supplies a measure of the less significant bits (LSB) of this digital word. The counts of the two counters 20 and 26 are transfered to latches 32 and 34, respectively.

The contents of the latches 32 and 34 are combined in latch 36.

Through the microprocessor bus interface 38 the contents of the latch 36 can be read by the microprocessor via the data lines 42.

Numeral 44 designates a comparator. The comparator 44 compares a digital frequency equivalent from the intermediate memories 32 and 34 with a predetermined limit value. The limit value is input as a digital word to a register 48 by the microprocessor through the microprocessor bus interface 38 and the data lines 46.

Numeral 50 designates a programmable time-counter which causes a delay of the output signal indicating the exceeding of a limit value. Thus, a signal activation is prevented at short-time disturbances. A status latch 52 is the form of a flip-flop stores the state "exceed" or "not exceed" of the limit value. Numeral 54 designates means for the internal gating of external states. Through these means 54 the effect of an exceeding of a limit value due to an external event can be transferred into the status channel through the input 55. The effect of an exceeding of a limit value can also be caused by the microprocessor by setting the bit 82 in the command register 58 through the line 86. An exceeding of a limit value can be recognized by the microprocessor through the microprocessor interface 38 by reading the bit 98 in the status register 88.

A command register 58 serves to determine and initiate the conversion mode.

The conversion channel 10 can be operated in a synchronous mode. In this mode a single conversion process is started by the processor. However, the conversion channel 10 can also be operated in an asynchronous mode. Then, the conversion process is started once and is periodically repeated. The choice between these two modes is made by bit 60 of the command register 58.

Bit 62 of the command register 58 determines which of the inputs 12 or 14 shall be switched through by the multiplexer 16, i.e. whether the frequency $FM_1$ applied to the input 12 or the frequency $FM_2$ applied to the input 14 shall be converted.

Bit 64 likewise controls the multiplexer 16 and starts a test process. To this end, a known reference frequency generated internally by the oscillator 24 or externally through the input 72 is applied to the input 68 of the multiplexer 16 through a frequency divider 66.

Bit 70 of the command register 58 controls the multiplexer 27 and determines whether the reference frequency $FR_2$ from the oscillator 24 or an external reference frequency $FR_1$ applied to the input 72 of the integrated device is used.

Bit 74 of the command register 58 determines whether the two inputs 12 and 14 of the converter channel 10 are operated in multiplex mode or in redundancy mode. In the multiplex mode the two inputs are switched by reprogramming the bit 62 of the command word 58 by the microprocessor. In the redundancy mode switching is effected by automatic internal monitoring of the two inputs 12 and 14. If the signal at the input 12 first drops below a minimum frequency threshold), which is recognized by a monitoring circuit 76, the multiplexer 16 is switched over by the monitoring circuit 76 and the inputs 14 is applied to the frequency-to-digital converter means 18.

Bit 78 determined whether a conversion shall take place or not. The bits 80 and 82 cause the signal indicating an exceeding of a limit value to be set or reset at the output 56 or the means 54, respectively. This is illustrated by the marks designated by "A" and "B" at the inputs 84 and 86, respectively.

Furthermore, the device comprises a status register 88. The status register 88 supplies information about the present state of the converter channel 10 through the data lines 90 and the microprocessor bus interface 38.

Bit 92 indicates the selected input 12 or 14. Bit 94 signals whether a test process is running. The bits 96 and 98 indicate whether a limit value is exceeded as indicated by the marks designated by "C" and "D" at the output of the comparator 44 and at the input 100 of the means 54, respectively. Bit 102 signals the converter state, i.e. whether a conversion is running or is terminated. The bits 104 and 106 signal an overflow of the counters 20 and 26, respectively.

Bit 108 indicates the result of a comparison of two keywords. The keywords shall ensure that no unwanted reprogramming is effected. To this end, a keyword must be written into the device before the data to be written can be supplied by the microprocessor bus interface 38 to data output 110. This keyword is compared with a reference keyword by the comparator 114. Only when the difference between the keyword and the reference keyword is zero the write address decoder 116 can be activated by the write line 112 and the data can be written in the registers of the device during a subsequent write access. Numeral 118 designates a read address decoder.

The device also comprises a range register having the sections M(22), T(66) and O(67).

With the M-section(22) the measuring frequency is divided such that a desired measuring frequency range is provided.

With the T-section(66) the reference frequency on the line 28 is divided such that one of the known test measuring frequencies is provided.

With the O-section(67) the reference frequency on the line 28 is divided such that a desired divided reference frequency for external purposes is provided on the output line 128 of the device 10. Data is transmitted to the O-section 67 from the microprocessor bus interface 38 through line 23.

After the basic function (register MTO (22,66,67), command (58)) is programmed by the microprocessor, the device can be used for measuring frequencies and for automatically monitoring limit values. To this end, the microprocessor additionally programs the limit value which is then monitored independently of the processor and which shall be signalized at the device output 56 when attained. The keyword and the reference keyword serve for the protection of this function against unwanted reprogramming. Furthermore, the processor bus interface can be decoupled after the programming by setting to 'high resistance' (3-state) with means (122) by the input 125.

Finally, the device comprises a stand-alone sequencer 120 having an error function indicator 123. Such a stand-alone sequencer allows the device to be configured independently of the processor from an external memory.

In the stand-alone mode, after the input 126 has been set, the device can be used without the microprocessor for monitoring a frequency limit value. To this end, the device automatically loads its configuration data from an external EPROM controlled by discrete input lines 129 when it is switched on. These configuration data are, e.g. the measuring range (e.g. 150 Hz to 156 kHz), the converting behaviour (asynchronous mode, redundancy mode), the frequency limit value and the delay time by which the information from the comparator shall be delayed.

After the limit comparator 44 has responded, the delay time is determined by a counter which is programmed by an 8-bit register 124. When the contents of the latches 32 and 34, on the one hand, and the register 48 containing the limit value, on the other hand, are equal, or when the value digitally presented in the latches 32 and 34 becomes higher than the limit value, the output 56 of the device is activated.

By programming the measuring range (range register MTO, section M(22)) the device is able to measure or monitor frequencies from 150 Hz to 30 MHz in approximately one millisecond. Lower frequencies can be handled by reducing the reference frequency associated by increasing the measuring time. Below the frequency of 1 kHz, i.e. a cycle time of one millisecond, the measuring time is increased to the cycle time.

A device of this type is realized in $2\mu$-technology having a complexity of about 8,500 gates on a surface of 66 square millimeters.

I claim:

1. Frequency-to-digital converter, being characterized as an integrated device neither containing nor forming part of a microprocessor, and comprising:
   (a) a processor bus interface (38) having data, address and control lines,
   (b) at least one converter channel (10) having
      at least one clock (24),
      at least one input (12,14),
      means (18) for frequency-to-digital conversion,
      a comparator (44) for comparing a digital frequency equivalent with a programmed digital word and which is arranged to signal exceeding of a limit value at an output (56) of the device through
      a programmable time-counter (50),
      a status memory (52) and
      means (54) for an internal gating of external states,
      a command register (58) which is arranged to determine and initiate a conversion mode,
      a range register (22,66,67) which is arranged to determine a conversion range, a test frequency and a output frequency, and
      a status register (88) which is arranged to offer information about a present state of the converter channel (10) to the processor, and
   (c) a stand-alone sequencer (120) having an error function indicator and controlled by discrete input lines, for processor-independent configuration of the device from an external memory.

2. Frequency-to-digital converter being characterized as an integrated device neither containing nor forming part of a microprocessor:
   (a) at least one converter channel (10) having
      at least one clock (24),
      at least one input (12,14),
      means (18) for frequency-to-digital conversion means operating according to a combined count and time method, a comparator (44) for comparing a digital frequency equivalent with a programmed digital word and which is arranged to signal exceeding of a limit value at an output (56) of the device through a programmable time-counter (50), a status memory (52) and means (54) for a internal gating of external states, a command register (58) which is arranged to determine and initiate a conversion mode, a range register (22,66,67) which is arranged to determined a conversion range of a test frequency and an output frequency, and a status register (68) which is arranged to offer information about the present state of the converter channel (10) to the processor, and (c) a stand-alone sequencer (120) having an error function indicator and controlled by discrete input lines, for processor-independent configuration of the device from an external memory.

3. Frequency-to-digital converter as set forth in claim 2, characterized in that the converter channel (10) has at least two inputs (12,14) which are adapted to be alternatively applied to the converter means (18).

4. Frequency-to-digital converter as set forth in claim 3, characterized in that the inputs (12,14) are adapted to be switched by the processor by reprogramming a command word.

5. Frequency-to-digital converter as set forth in claim 3, characterized by monitoring means for switching the inputs (12,14) when a measuring frequency drops below a minimum frequency.

6. Frequency-to-digital converter as set forth in claim 2, characterized in that the converter channel (10) is programmable to the synchronous mode, wherein a single conversion process is initiated by the processor.

7. Frequency-to-digital converter as set forth in claim 2, characterized in that the converter channel (10) is programmable to an asynchronous mode, a conversion process being started once and repeated automatically.

8. Frequency-to-digital converter as set forth in claim 2, characterized in that writing actions on the device are locked by keywords.

9. Frequency-to-digital converter as set forth in claim 1, characterized in that the processor bus interface (38) is adapted to be switched to high resistance by a discrete input of the integrated device to decouple the bus by a monitoring function.

10. Frequency-to-digital converter as set forth in claim 2, characterized by a test circuit which permits testing of the device by a microprocessor.

11. Frequency-to-digital converter as set forth in claim 2, characterized by means for generating known frequencies within said integrated device and means for supplying said known frequencies to the input of the converter channel (10).

12. Frequency-to-digital converter as set forth in claim 11, characterized in that said frequency generating means are adapted to generate several frequencies in each converting range.

13. Frequency-to-digital converter as set forth in claim 1, characterized by a pin on said integrated device and means responsive to a signal at that pin for changing the processor bus interface (38) in an operation mode to different types of busses.

* * * * *